(12) United States Patent
Chakraborty et al.

(10) Patent No.: US 12,134,822 B2
(45) Date of Patent: Nov. 5, 2024

(54) CLEANING MATERIALS AND PROCESSES FOR LITHIUM PROCESSING EQUIPMENT

(71) Applicant: Applied Materials, Inc., Santa Clara, CA (US)

(72) Inventors: Tapash Chakraborty, Thane (IN); Nitin Deepak, Thane (IN); Prerna Sonthalia Goradia, Mumbai (IN); Bahubali S. Upadhye, Bangalore (IN); Nilesh Chimanrao Bagul, Bangalore (IN); Subramanya P. Herle, Mountain View, CA (US); Visweswaren Sivaramakrishnan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 532 days.

(21) Appl. No.: 17/529,463

(22) Filed: Nov. 18, 2021

(65) Prior Publication Data

US 2022/0162747 A1  May 26, 2022

Related U.S. Application Data

(60) Provisional application No. 63/116,431, filed on Nov. 20, 2020.

(51) Int. Cl.
*C23C 16/44* (2006.01)
(52) U.S. Cl.
CPC ...... *C23C 16/4405* (2013.01); *C23C 16/4407* (2013.01)

(58) Field of Classification Search
CPC .................. C23C 16/4405; C23C 16/4407
See application file for complete search history.

(56) References Cited

U.S. PATENT DOCUMENTS

2012/0000490 A1    1/2012   Chung et al.
2012/0015525 A1    1/2012   Endo et al.

FOREIGN PATENT DOCUMENTS

CN    114641593 A     6/2022
EP       1394842 B1    3/2004
(Continued)

OTHER PUBLICATIONS

JP-2011522117-A, Machine Translation. (Year: 2024).*
(Continued)

*Primary Examiner* — Duy Vu N Deo
*Assistant Examiner* — Christopher Remavege
(74) *Attorney, Agent, or Firm* — Kilpatrick Townsend & Stockton LLP

(57) ABSTRACT

Exemplary methods of removing lithium-containing deposits may include heating a surface of a lithium-containing deposit. The surface may include oxygen or nitrogen, and the lithium-containing deposit may be disposed on a surface of a processing chamber. The methods may include contacting the surface of the lithium-containing deposit with a hydrogen-containing precursor. The contacting may hydrogenate the surface of the lithium-containing deposit. The methods may include contacting the lithium-containing deposit with a nitrogen-containing precursor to form volatile byproducts. The methods may include exhausting the volatile byproducts of the lithium-containing deposit from the processing chamber.

20 Claims, 2 Drawing Sheets

(56) References Cited

FOREIGN PATENT DOCUMENTS

| JP | 2011522117 A | * | 7/2011 | ......... C23C 16/4405 |
|---|---|---|---|---|
| KR | 10-0562208 B1 | | 5/2006 | |
| TW | 460943 B | | 10/2001 | |
| TW | I266811 B | | 11/2006 | |
| TW | 201120209 A | | 6/2011 | |
| TW | 201209916 A | | 3/2012 | |
| WO | 2011-047302 A2 | | 4/2011 | |

OTHER PUBLICATIONS

International Search Report and Written Opinion mailed Feb. 25, 2022 in International Patent Application No. PCT/US2021/059695, 7 pages.

* cited by examiner

CLEANING MATERIALS AND PROCESSES FOR LITHIUM PROCESSING EQUIPMENT

CROSS-REFERENCE TO RELATED APPLICATIONS

This application claims the benefit of, and priority to U.S. Provisional Application Ser. No. 63/116,431, filed Nov. 20, 2020, which is hereby incorporated by reference in its entirety for all purposes.

TECHNICAL FIELD

The present technology relates to thin film deposition processes and chamber components. More specifically, the present technology relates to modified components and deposition methods.

BACKGROUND

Thin-film batteries are formed by processes which produce controlled layers of material on substrate surfaces. Producing material layers on a substrate requires controlled methods of formation on large-area substrates. As device sizes continue to shrink, multilayer battery processing chambers are becoming more complex, as the processing may include a greater number of processing operations to produce discreet layers and structures. These more complex fabrication techniques may increase the number of deposition and removal operations performed within the processing chamber. During any number of these operations, deposition products may form on chamber surfaces and contaminate the processing chamber or form unwanted deposits, which may affect processing.

Thus, there is a need for improved systems and methods that can be used to produce high quality devices and structures. These and other needs are addressed by the present technology.

SUMMARY

Exemplary methods of removing lithium-containing deposits may include heating a surface of a lithium-containing deposit. The surface may include oxygen or nitrogen, and the lithium-containing deposit may be disposed on a surface of a processing chamber. The methods may include contacting the surface of the lithium-containing deposit with a hydrogen-containing precursor. The contacting may hydrogenate the surface of the lithium-containing deposit. The methods may include contacting the lithium-containing deposit with a nitrogen-containing precursor to form volatile byproducts. The methods may include exhausting the volatile byproducts of the lithium-containing deposit from the processing chamber.

In some embodiments, the hydrogen-containing precursor may be or include diatomic hydrogen or ammonia. The surface of the lithium-containing deposit may include lithium nitride. The method may include contacting the surface of the lithium-containing deposit with diatomic hydrogen. The method may include, subsequently contacting the surface of the lithium-containing deposit with ammonia. The subsequent contacting may produce lithium amide. The nitrogen-containing precursor may be or include hexamethyldisilazane. The volatile byproducts may be characterized by a boiling point of less than or about 200° C. The surface of the lithium-containing deposit may be heated to a temperature of greater than or about 300° C., while a temperature of a bulk region of the lithium-containing deposit may be maintained below or about 200° C. The heating may be performed with a heater positioned within the processing chamber. The method of removing lithium-containing deposits may be performed under vacuum conditions within the processing chamber. Water content within the processing chamber may be maintained at less than or about 100 ppm during the method of removing lithium-containing deposits.

Some embodiments of the present technology may encompass methods of removing lithium-containing deposits. The methods may include heating a surface of a lithium-containing deposit. The surface may include lithium oxide. A bulk of the lithium-containing deposit may be or include lithium. The lithium-containing deposit may be disposed on a surface of a processing chamber. The methods may include contacting the surface of the lithium-containing deposit with diatomic hydrogen or ammonia. The contacting may produce lithium hydroxide on the surface of the lithium-containing deposit. The methods may include contacting the lithium-containing deposit with a removal precursor to form volatile byproducts. A temperature within the processing chamber may be maintained below or about 300° C. at processing conditions. The methods may include exhausting the volatile byproducts of the lithium-containing deposit from the processing chamber.

In some embodiments, the removal precursor may include one or more of a beta-diketone, 1,4,7,10-tetraoxacyclododecane, tetramethylpiperidine, diisopropylamine, or hexamethyldisilazane. The removal precursor may be a first removal precursor. The first removal precursor may remove a surface layer of the lithium-containing deposit. The method may include contacting the lithium-containing deposit with a second removal precursor to form volatile byproducts of bulk material of the lithium-containing deposit. The lithium-containing deposit may also include lithium nitride at the surface of the lithium-containing deposit. The method of removing lithium-containing deposits may be performed under vacuum conditions within the processing chamber. Water content within the processing chamber may be maintained at less than or about 100 ppm during the method of removing lithium-containing deposits.

Some embodiments of the present technology may encompass methods of removing lithium-containing deposits. The methods may include heating a surface of a lithium-containing deposit. The surface may include lithium nitride. A bulk of the lithium-containing deposit may be or include lithium. The lithium-containing deposit may be disposed on a surface of a processing chamber. The methods may include contacting the surface of the lithium-containing deposit with diatomic hydrogen or ammonia. The contacting may produce lithium hydroxide on the surface of the lithium-containing deposit. The methods may include contacting the lithium-containing deposit with a removal precursor to form volatile byproducts. A temperature within the processing chamber may be maintained below or about 300° C. at processing conditions. The methods may include exhausting the volatile byproducts of the lithium-containing deposit from the processing chamber.

In some embodiments, contacting the surface of the lithium-containing deposit with diatomic hydrogen or ammonia may include contacting the surface of the lithium-containing deposit with diatomic hydrogen. The methods may include, subsequently contacting the surface of the lithium-containing deposit with ammonia. The subsequent contacting may produce lithium amide. The removal precursor may include one or more of 1,4,7,10-tetraoxacyclododecane, tetramethylpiperidine, dimethylamine, diethylamine, di-n-propylamine, di-isopropylamine, di-t-butylamine, isopropylamine, t-butylamine, hexamethyldisilazane, or a beta-diketone including dipivaloylmethane, isobutyrylpivaloylmethane, hexafluoropentanedione, or trifluoroacetylpivaloylmethane. The removal precursor may be a first removal precursor. The first removal precursor may remove a surface layer of the lithium-containing deposit. The methods may include contacting the lithium-containing deposit with a second removal precursor to form volatile byproducts of bulk material of the lithium-containing deposit. The method of removing lithium-containing deposits may be performed under vacuum conditions within the processing chamber. Water content within the processing chamber may be maintained at less than or about 100 ppm during the method of removing lithium-containing deposits.

Such technology may provide numerous benefits over conventional systems and techniques. For example, the systems may perform cleaning operations capable of removing deposits throughout the processing chamber with gas-phase removal. Additionally, methods according to embodiments of the present technology may afford removal from processing chamber surfaces, while maintaining vacuum conditions, which may limit moisture or other contamination within the chamber. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
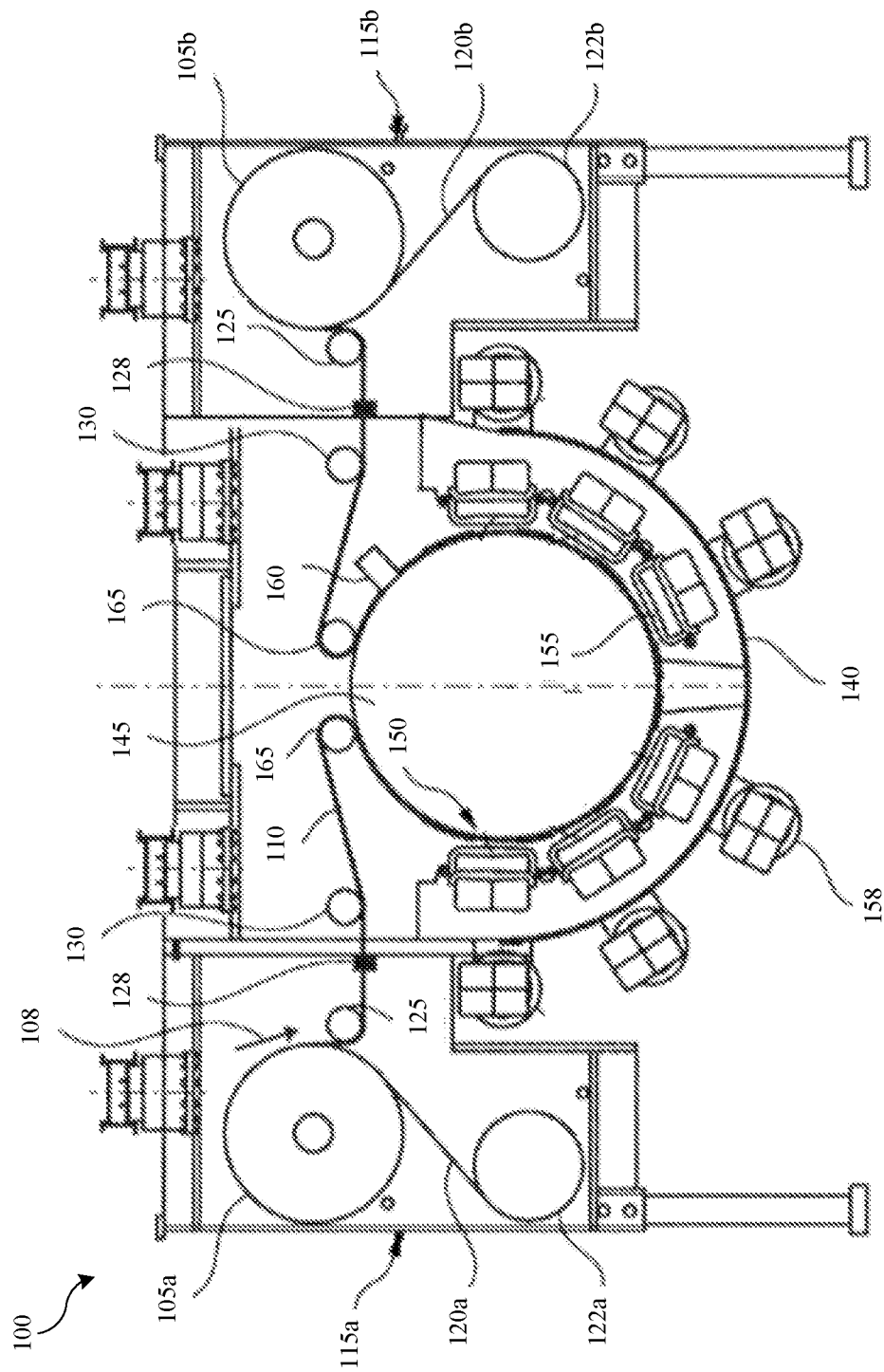
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In roll-to-roll fabrication processes, such as of metal or other multilayer materials, components may be deposited on a substrate as it passes through a processing environment. Some processing systems may control the environment within the processing chamber as the substrate travels through the chamber. Materials may then be deposited in layers across the substrate to produce the layered structure. However, this process may also deposit materials on the chamber components. Cleaning operations may then be performed to remove the material from chamber surfaces to limit obstruction or damage to subsequent processing.

As one non-limiting example encompassed by the present technology, lithium deposition may be performed in a roll-to-roll or other deposition process. The deposition may cause lithium to be formed not only on the substrate as desired, but also on exposed surfaces within the processing chamber. The lithium may include a bulk lithium material, as well as lithium-containing materials, such as lithium oxide and/or lithium nitride, which may form at an upper or exposed surface around the bulk material. Conventional technology has typically removed these materials by performing regular maintenance cleaning processes. Although lithium may be removed relatively easily with water-based cleaning, the processes may cause significant chamber downtime. For example, typically after a certain amount of processing time, the chamber will be opened and cleaned by hand. After cleaning, the chamber must be resealed and purged prior to proceeding with subsequent processing. This downtime may extend for up to a day for cleaning, and the process may both fail to remove difficult to access deposits within the chamber, and may fail to fully purge contaminants from the chamber, which may cause defects during subsequent processing.

The present technology may overcome these limitations by performing an in situ cleaning process, which may be performed without exposing the chamber environment to atmosphere. By performing reactive exposure operations within the chamber environment, and utilizing particular precursors that in some embodiments may afford removal at temperatures below the melting point of lithium, cleaning may ensure more thorough removal, and may limit downtime of the system. After describing general aspects of a chamber according to embodiments of the present technology in which deposition or other processing may be performed, methods of cleaning processing systems according to embodiments of the present technology will be described. Although the technology will be described with respect to cleaning in evaporative deposition systems, it is to be understood that the present technology is not intended to be limited to the specific materials and processing discussed. The techniques described may be used to perform cleaning or removal operations in any number of processing chambers or processing environments for a host of materials, which may or may not include lithium.

FIG. 1 shows a cross-sectional view of an exemplary processing system 100 according to some embodiments of the present technology. Although the chamber includes a specific roller configuration, it is to be understood that exemplary chambers may include fewer or more components than described, and may or may not include any of the characteristics as illustrated, as the figure illustratively represents various components that may be incorporated in processing chambers according to embodiments of the present technology. As illustrated, in some embodiments, the processing system may generally be configured or include a chamber section configured to house a substrate storage spool 105a, as illustrated in FIG. 1. According to some embodiments, the flexible substrate 110 to be processed may be provided on a storage spool 105a. The storage spool may be placed in a separate spool chamber 115a, which may maintain the substrate separated from a processing environment. In some embodiments an interleaf 120a may be provided between the adjacent layers of the flexible substrate 110 such that direct contact may be reduced or eliminated between any layer of the flexible substrate 110 and an adjacent layer of the flexible substrate on the storage spool 105*a*.

In operation, the substrate may be unwound from the storage spool as indicated by the substrate movement direction shown by arrow 108. The flexible substrate 110 may be any substrate or web material on which deposition may be performed. For example, the substrate may be layers of copper or aluminum, as well as any other conductive or insulative material on which deposition may be performed, including polymeric material in some embodiments. Upon unwinding of the flexible substrate 110 from the storage spool 105*a* the interleaf 120*a*, if present, may be wound on the interleaf roll 122*a*. The flexible substrate 110 may be guided via one or more guide rollers 125 through any number of configurations through the system. The flexible substrate 110 may also be guided by one or more substrate guide control units 130 controlling the run of the flexible substrate 110, for example, by performing fine-tune adjusting of the orientation or position of the flexible substrate 110.

As the flexible substrate 110 is fed from the storage spool 105*a* in the spool chamber 115*a*, the substrate may pass to a processing chamber 140, which may be positioned adjacent the spool chamber in the processing system. Processing chamber 140 may be sealed in some embodiments, and may be coupled with a pumping system configured to produce a vacuum environment within the processing chamber 140. Within the processing chamber 140 may be included a coating drum 145. Utilizing any number of guide rollers or control units within the processing chamber, the flexible substrate 110 may be translated through one or more processing regions 150 positioned about the coating drum 145 and corresponding to positions of deposition units 155. Each deposition unit 155 may be connected to a corresponding or dedicated control and/or power provision unit 158. Although six such deposition units 155 are shown included in processing system 100, it is to be understood that any number more or less deposition stations may be incorporated in systems according to embodiments of the present technology. During operation, the coating drum 145 may rotate counterclockwise to draw or translate the flexible substrate 110 through the systems. It is to be understood that in operation the drum may rotate in either direction depending on the process being performed, and direction arrow 108 is included only to facilitate explanation of one possible system operation.

To maintain a vacuum environment within the processing chamber 140, processing system 100 may include one or more seals, such as seals 128, which may be static seals or dynamic seals through which the substrate may be passed. The seals may allow a pressure differential to be maintained between the processing chamber 140, which may be operated under vacuum conditions, and the spool chambers 115, in which flexible substrate 110 winding and unwinding operations may be performed. Such a set-up may reduce the complexity of replacing a spool 105 after the substrate has been completely processed. Accordingly, the processing chamber 140 may be maintained at any type of vacuum conditions while allowing ambient pressure or limited vacuum in the handling chambers, or spool chambers 115.

Deposition may occur at one or more processing regions, and may involve evaporative deposition, atomic-layer deposition, physical-vapor deposition, plasma-enhanced deposition, or any other chemical vapor deposition that may be performed, along with spray coating, or other processing. Substrate cleaning may also be performed in embodiments of the present technology utilizing a cleaning unit 160. Cleaning unit 160 may be positioned within the processing chamber 140 to interact with the substrate while the substrate still may be positioned on the drum. This may facilitate a defined contact pressure application of the cleaning unit against the flexible substrate 110. Additionally or alternatively, the cleaning unit may be positioned in the free span of the flexible substrate 110 between the coating drum and the next guide roller or tension roller. Hence, one or more cleaning units may be provided where each cleaning unit may be positioned on each side of the substrate or at multiple locations along a single surface of the substrate. By locating the cleaning unit or units prior to an engagement roller, such as deflection roller 165, contaminant particles that may be present on the substrate may be removed prior to contact with the roller, which may form a print of the particle into the deposited films or substrate, and which may produce pinholes or other defects.

After being cleaned by the cleaning unit 160, the flexible substrate 110 may travel over one or more deflection rollers 165. The one or more deflection rollers downstream of the coating unit and the cleaning unit may also serve as tensioning rollers that may allow the substrate to have a different tension during the deposition from that during subsequent winding of the substrate. After travelling over one or more guide rollers or control units as illustrated, the substrate may pass to a second spool chamber 115*b*, where the substrate may be wound on a second spool 105*b*. Additionally, in some embodiments a second interleaf 120*b* may be provided from a second interleaf roller 122*b*, and disposed between layers of the flexible substrate 110 to reduce or limit damage to the web.

Figure 2:
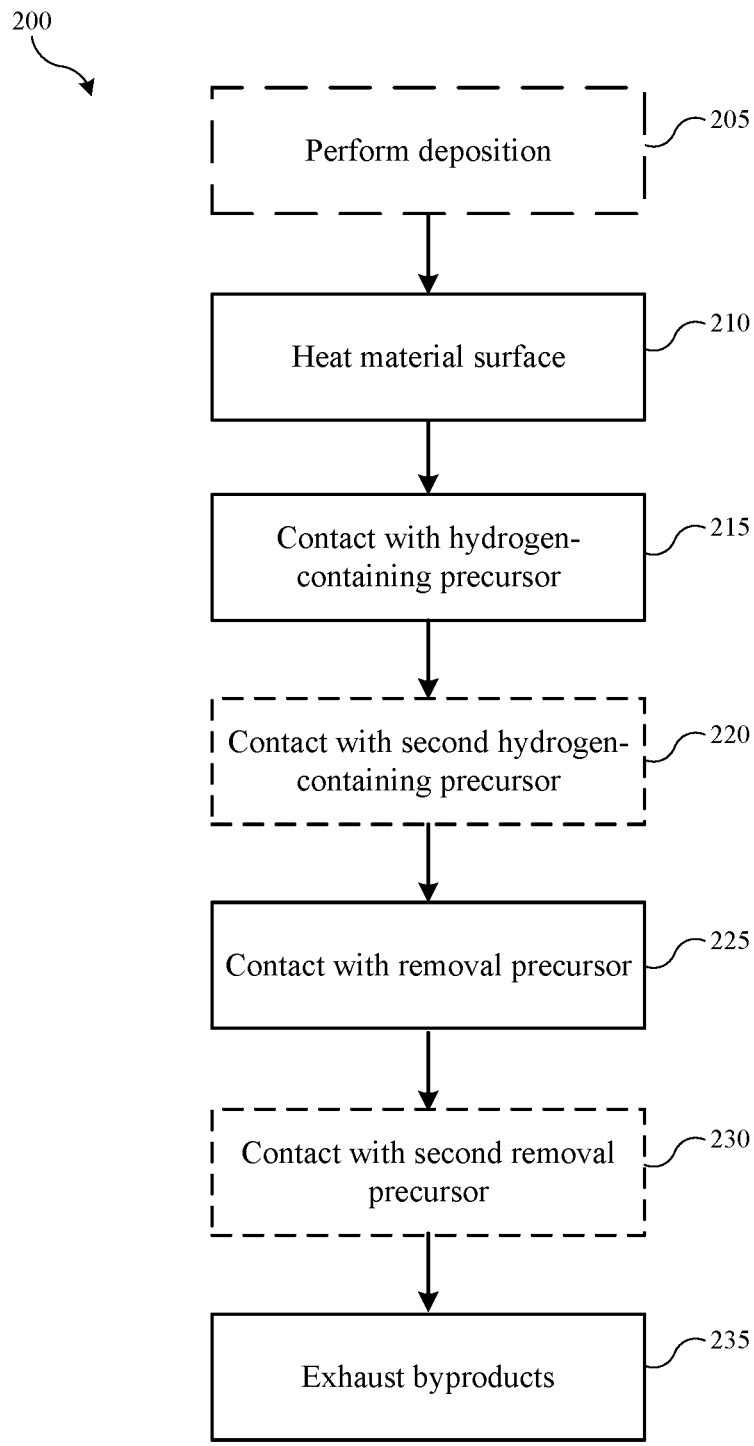
FIG. 2 shows exemplary operations in a removal method according to some embodiments of the present technology.

FIG. 2 shows exemplary operations in a removal method 200 according to some embodiments of the present technology. The method may be performed in a variety of processing chambers, including processing chamber 140 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations that may involve cleaning operations occurring after deposition or substrate processing has been performed. For example, additional processing operations may include forming structures on a flexible and/or conductive substrate, which may include both forming and removing material. Prior processing operations may be performed in the chamber in which method 200 may be performed. For example, method 200 may optionally include performing a deposition on a substrate transferred through a processing chamber, such as processing chamber 140 described above, at optional operation 205. The deposition may include any number of operations utilizing any number of deposition units, and in some embodiments the deposition may include depositing lithium metal on a substrate passed through the processing chamber, such as by performing a thermal evaporation process at one or more of the deposition units. Once the deposition operation is complete, such as when the substrate has been re-spooled and fully drawn through the processing chamber, residual deposits may remain within the chamber, or on one or more surfaces of the processing chamber, deposition units, shields, or other structures associated with the processing chamber.

As explained previously, conventional technology may be limited to opening the chamber and performing manual cleaning operations, which may be incomplete and cause extended chamber downtime. The present technology may perform reactive removal utilizing processes to produce volatile byproducts of the material deposits about the chamber, such as lithium-containing deposits. Although the remaining disclosure will regularly reference lithium-containing deposits, it is to be understood that the methods described may be applicable to other metals or materials to be removed from a processing chamber as well. Accordingly, the present technology is not intended to be limited solely to lithium removal.

Conventional cleaning may not have utilized in situ etching, which may normally be performed in processing chambers for semiconductor fabrication. While halogen precursors, including plasma-enhanced halogen precursors, may generally be used to perform chamber cleaning operations, some materials may have counterproductive reactivity with the materials. Although plasma radicals may provide an amount of energy for interaction, when lithium metal deposits are included, the produced materials may not be volatile. For example, both lithium chloride and lithium fluoride may be characterized by boiling points above 1300° C., which may limit or prevent removal of the lithium-containing deposits from the processing chamber. Alternatively, while organometallic compounds may be formed with lithium at lower temperatures, many organometallic compounds are pyrophoric, which may be unsuitable for some processing chambers. Many other lithium products may similarly reduce the activity of the lithium, which may further challenge removal from the processing chamber. Additionally, based on coatings and other materials within the processing chamber, a surface of the lithium-containing deposits may be oxidized, or may include one or more materials such as lithium nitride, lithium oxide, or some other lithium-containing material. Accordingly, while certain materials may be delivered to remove lithium, the same materials may be less capable or incapable of removing the surface materials on the deposits within the chamber.

Removal may also be challenged due to the low melting point of lithium. Accordingly, were the chamber heated to temperatures above 200° C., for example, lithium may begin to melt, which may cause dripping onto additional regions of the chamber or deposition units, complicating the removal. The present technology may overcome some or all of these issues by controlling chamber temperature, and thus a temperature within a bulk of the lithium-containing deposits may remain below a melting point of lithium while surface temperatures may be increased to facilitate reaction with removal precursors.

As stated above, an exposed surface of the lithium-containing deposits may include lithium oxide or lithium nitride, which may limit or prevent access to underlying bulk lithium for removal. Embodiments of the present technology may perform one or more reactions to modify the surface material on the lithium-containing deposits before removing the deposits by producing volatile byproducts that may be exhausted from the processing chamber. For example, a surface of the lithium-containing deposit, which may include lithium oxide or lithium nitride, may be heated at operation 210. The heating may be performed in any number of ways according to embodiments of the present technology. For example, while the chamber may be heated to a first temperature, the first temperature may be maintained below or about the melting temperature of lithium under processing conditions. For example, depending on the pressure within the chamber, the chamber temperature, such as the temperature of heating elements disposed within the chamber to control processing temperature, may be maintained below or about 200° C., and may be maintained below or about 180° C., below or about 160° C., below or about 140° C., below or about 120° C., below or about 100° C., below or about 80° C., below or about 60° C., or less.

Additionally, one or more heating elements, such as IR heaters, heat lamps, or directional heaters including laser heating, may be employed to heat the surface of lithium-containing deposits, which may maintain the bulk of the deposits at any of the temperatures above, while heating the surface to temperatures greater than or about 200° C., and which may heat the surface to temperatures greater than or about 250° C., greater than or about 300° C., greater than or about 350° C., greater than or about 400° C., greater than or about 450° C., greater than or about 500° C., greater than or about 550° C., greater than or about 600° C., greater than or about 650° C., greater than or about 700° C., greater than or about 750° C., greater than or about 800° C., greater than or about 850° C., greater than or about 900° C., greater than or about 950° C., greater than or about 1000° C., or more. To produce heating limited to the surface, which may limit or prevent melting of underlying lithium, the heating elements may be operated for short periods of time, and which may coincide with pulsing of one or more precursors delivered to react with one or more materials of the lithium-containing deposits.

As noted above, the lithium-containing deposits may include one or more of lithium metal, lithium oxide, lithium nitride, lithium hydroxide, lithium hydride, or lithium amide, among any number of other lithium-containing materials. While some materials, such as lithium hydroxide and lithium amide, may be more readily removed from the deposits, lithium oxide and lithium nitride may challenge removal. Accordingly, some embodiments of the present technology may contact the surface of the lithium-containing deposit with a hydrogen-containing precursor at operation 215. The hydrogen-containing precursor may include any number of precursors having hydrogen, including organic compounds, as well as diatomic hydrogen, ammonia, or any other hydrogen-containing material, which may donate one or more hydrogen atoms to the surface oxide or nitride materials, and which may hydrogenate the surface of the lithium-containing deposit.

For example, lithium oxide may react with hydrogen or ammonia at temperatures above or about 300° C., which may be produced at the surface of the lithium deposits as explained above, while the bulk temperature is maintained lower, such as below or about 200° C., below or about 100° C., or less. The reaction may produce lithium hydroxide. In some embodiments, ammonia may beneficially produce lithium amide as well as lithium hydroxide, which may more readily be removed than other byproducts, such as lithium hydride. Additionally, lithium nitride may also react with hydrogen or ammonia at temperatures above or about 300° C. or more, which may produce lithium amide. However, the direct reaction with ammonia and lithium nitride may be more challenging to produce at lower temperatures. Thus, in some embodiments the process may include first contacting the surface of the deposits with hydrogen, followed by a second contacting at optional operation 220, in which the deposits may then be further contacted with ammonia as a second hydrogen-containing precursor, which may produce lithium amide.

In some embodiments, this process may be performed with both lithium oxide and lithium nitride materials. Although lithium hydride may be produced to a degree in the first reaction, lithium hydride may more readily be converted to lithium amide with hydrogen as a byproduct, which may be exhausted from the chamber. When two contacting operations are performed with hydrogen-containing precursors the operations may be performed at similar or different temperatures in some embodiments. For example, after the first contacting has been performed, such as with hydrogen, the surface temperature may be raised for the second contacting, which may be performed at a temperature of greater than or about 50° C. higher than a temperature at which the first contacting may be performed, and may be performed at a temperature of greater than or about 100° C. higher than a temperature for the first contacting, or more. In some embodiments where lithium nitride is included, in addition or alternatively to providing a hydrogen-containing precursor, the lithium nitride may be thermally decomposed to lithium, and nitrogen may be exhausted from the chamber. The temperature for decomposition may be less than or about 500° C. depending on chamber conditions, and this temperature may be maintained at the surface of the deposit, while the bulk temperature is maintained at a lower temperature.

After the one or more surface reactions have been performed, a removal operation may be performed by contacting the lithium-containing deposit with a removal precursor, which may produce a lithium complex in some embodiments of the present technology, at operation 225. For example, to remove the surface material, one or more nitrogen-containing materials may be provided to the substrate to interact with the surface materials. By converting the surface materials to hydrogenated materials, a more basic material may be produced, which may more readily extract a proton from the removal material, producing byproducts such as a volatile lithium complex, as well as water, hydrogen, nitrogen, or ammonia, among other materials, which may be exhausted from the chamber with the lithium complex. In some embodiments, once the surface materials have been removed, the process may continue, which may remove the underlying lithium. This may be performed by continuing a flow of the removal precursor, or by contacting the lithium with a second removal precursor at optional operation 230. The surface materials and/or the underlying lithium as volatile byproducts may then be exhausted from the processing chamber at operation 235. The byproducts may all be characterized by a boiling point at processing conditions or at atmospheric conditions of less than or about 200° C., and may be characterized by a boiling point of less than or about 180° C., less than or about 160° C., less than or about 140° C., less than or about 120° C., less than or about 100° C., less than or about 80° C., less than or about 60° C., or less.

The removal precursors may include one or more precursors that may react with lithium, and may be characterized by a boiling point of less than or about 500° C., which may be reduced under vacuum conditions, and which may allow the bulk temperature of the lithium-containing deposits to be maintained at a temperature below or about 200° C., while the surface temperature may be maintained or momentarily adjusted to higher temperatures, such as with ablation, laser anneal, or surface heating as discussed above. Exemplary removal precursors may be or include one or more precursors such as 1,4,7,10-tetraoxacyclododecane, tetramethylpiperidine, dimethylamine, diethylamine, di-n-propylamine, di-isopropylamine, di-t-butylamine, isopropylamine, t-butylamine, hexamethyldisilazane, or a beta-diketone including dipivaloylmethane, isobutyrylpivaloylmethane, hexafluoropentanedione, and trifluoroacetylpivaloylmethane, any of which, including combinations, may be used as the first and/or second removal precursors. In some embodiments, one or more additional precursors may be delivered with the removal precursors including oxygen, which may be delivered at a flow rate ratio to the removal precursor of less than 1, which may facilitate removal of lithium from the deposits.

As noted above, in some embodiments the methods may be performed within a sealed chamber at vacuum conditions, which may facilitate maintaining reactions and/or bulk lithium-containing deposit temperatures below a melting point of lithium. Accordingly, in some embodiments a pressure within the processing chamber may be maintained at a pressure of less than or about 500 Torr, and may be maintained at a pressure of less than or about 400 Torr, less than or about 300 Torr, less than or about 200 Torr, less than or about 100 Torr, less than or about 50 Torr, less than or about 10 Torr, less than or about 5 Torr, less than or about 1 Torr, less than or about 0.1 Torr, less than or about 0.01 Torr, or less. According to some embodiments of the present technology, the pressure may be maintained throughout the method, although in some embodiments the pressure may be adjusted higher or lower between operations to facilitate reactions or removal.

By performing in situ removal of lithium-containing deposits according to some embodiments of the present technology, cleaning operations may be performed without exposing the chamber environment to atmosphere. This may limit contamination, which may allow a reduction in cleaning time by limiting subsequent purge operations. The present technology may perform cleaning while minimizing contaminants within the processing chamber. For example, water vapor, and/or residual materials including carbon, nitrogen, hydrogen, and/or a halogen or other contaminants may be limited in the processing chamber, and may be maintained at less than or about 1,000 ppm within the processing chamber in some embodiments while performing methods or subsequent the exhausting operations according to embodiments of the present technology. Additionally, any or all of these contaminants may be maintained at less than or about 500 ppm, less than or about 250 ppm, less than or about 100 ppm, less than or about 50 ppm, less than or about 10 ppm, less than or about 5 ppm, less than or about 1 ppm, or less. This may increase throughput and lower downtime over conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the deposit" includes reference to one or more deposits and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of removing lithium-containing deposits, the method comprising:
    heating a surface of a lithium-containing deposit, wherein the surface comprises oxygen or nitrogen, and wherein the lithium-containing deposit is disposed on a surface of a processing chamber;
    contacting the surface of the lithium-containing deposit with a hydrogen-containing precursor, wherein the contacting hydrogenates the surface of the lithium-containing deposit;
    contacting the lithium-containing deposit with a nitrogen-containing precursor to form volatile byproducts; and
    exhausting the volatile byproducts of the lithium-containing deposit from the processing chamber.

2. The method of removing lithium-containing deposits of claim 1, wherein the hydrogen-containing precursor comprises diatomic hydrogen or ammonia.

3. The method of removing lithium-containing deposits of claim 2, wherein the surface of the lithium-containing deposit comprises lithium nitride, and wherein the method further comprises:
    contacting the surface of the lithium-containing deposit with diatomic hydrogen; and
    subsequently contacting the surface of the lithium-containing deposit with ammonia, wherein the subsequent contacting produces lithium amide.

4. The method of removing lithium-containing deposits of claim 1, wherein the nitrogen-containing precursor comprises hexamethyldisilazane.

5. The method of removing lithium-containing deposits of claim 1, wherein the volatile byproducts are characterized by a boiling point of less than or about 200° C.

6. The method of removing lithium-containing deposits of claim 1, wherein the surface of the lithium-containing deposit is heated to a temperature of greater than or about 300° C., while a temperature of a bulk region of the lithium-containing deposit is maintained below or about 200° C.

7. The method of removing lithium-containing deposits of claim 6, wherein the heating is performed with a heater positioned within the processing chamber.

8. The method of removing lithium-containing deposits of claim 1, wherein the method of removing lithium-containing deposits is performed under vacuum conditions within the processing chamber.

9. The method of removing lithium-containing deposits of claim 8, wherein water content within the processing chamber is maintained at less than or about 100 ppm during the method of removing lithium-containing deposits.

10. A method of removing lithium-containing deposits, the method comprising:
    heating a surface of a lithium-containing deposit, wherein the surface comprises lithium oxide, wherein a bulk of the lithium-containing deposit comprises lithium, and wherein the lithium-containing deposit is disposed on a surface of a processing chamber;
    contacting the surface of the lithium-containing deposit with diatomic hydrogen or ammonia, wherein the contacting produces lithium hydroxide on the surface of the lithium-containing deposit;
    contacting the lithium-containing deposit with a removal precursor to form volatile byproducts, wherein a temperature within the processing chamber is maintained below or about 300° C. at processing conditions; and
    exhausting the volatile byproducts of the lithium-containing deposit from the processing chamber.

11. The method of removing lithium-containing deposits of claim 10, wherein the removal precursor comprises a beta-diketone, 1,4,7,10-tetraoxacyclododecane, tetramethylpiperidine, diisopropylamine, or hexamethyldisilazane.

12. The method of removing lithium-containing deposits of claim 10, wherein the removal precursor is a first removal precursor, wherein the first removal precursor removes a surface layer of the lithium-containing deposit, and wherein the method further comprises:
    contacting the lithium-containing deposit with a second removal precursor to form volatile byproducts of bulk material of the lithium-containing deposit.

13. The method of removing lithium-containing deposits of claim 10, wherein the lithium-containing deposit further comprises lithium nitride at the surface of the lithium-containing deposit.

14. The method of removing lithium-containing deposits of claim 10, wherein the method of removing lithium-containing deposits is performed under vacuum conditions within the processing chamber.

15. The method of removing lithium-containing deposits of claim 10, wherein water content within the processing chamber is maintained at less than or about 100 ppm during the method of removing lithium-containing deposits.

16. A method of removing lithium-containing deposits, the method comprising:
    heating a surface of a lithium-containing deposit, wherein the surface comprises lithium nitride, wherein a bulk of the lithium-containing deposit comprises lithium, and wherein the lithium-containing deposit is disposed on a surface of a processing chamber;
    contacting the surface of the lithium-containing deposit with diatomic hydrogen or ammonia, wherein the contacting produces lithium hydroxide on the surface of the lithium-containing deposit;

contacting the lithium-containing deposit with a removal precursor to form volatile byproducts, wherein a temperature within the processing chamber is maintained below or about 300° C. at processing conditions; and exhausting the volatile byproducts of the lithium-containing deposit from the processing chamber.

17. The method of removing lithium-containing deposits of claim 16, wherein contacting the surface of the lithium-containing deposit with diatomic hydrogen or ammonia comprises:

contacting the surface of the lithium-containing deposit with diatomic hydrogen; and subsequently contacting the surface of the lithium-containing deposit with ammonia, wherein the subsequent contacting produces lithium amide.

18. The method of removing lithium-containing deposits of claim 16, wherein the removal precursor comprises one or more of 1,4,7,10-tetraoxacyclododecane, tetramethylpiperidine, dimethylamine, diethylamine, di-n-propylamine, di-isopropylamine, di-t-butylamine, isopropylamine, t-butylamine, hexamethyldisilazane, or a beta-diketone including dipivaloylmethane, isobutyrylpivaloylmethane, hexafluoropentanedione, or trifluoroacetylpivaloylmethane.

19. The method of removing lithium-containing deposits of claim 16, wherein the removal precursor is a first removal precursor, wherein the first removal precursor removes a surface layer of the lithium-containing deposit, and wherein the method further comprises:

contacting the lithium-containing deposit with a second removal precursor to form volatile byproducts of bulk material of the lithium-containing deposit.

20. The method of removing lithium-containing deposits of claim 16, wherein the method of removing lithium-containing deposits is performed under vacuum conditions within the processing chamber, and wherein water content within the processing chamber is maintained at less than or about 100 ppm during the method of removing lithium-containing deposits.

* * * * *